(12) United States Patent
Nishimura

(10) Patent No.: US 9,035,248 B2
(45) Date of Patent: May 19, 2015

(54) DRAWING APPARATUS, AND METHOD OF MANUFACTURING ARTICLE

(71) Applicant: CANON KABUSHIKI KAISHA, Tokyo (JP)

(72) Inventor: Naosuke Nishimura, Kawachi-gun (JP)

(73) Assignee: CANON KABUSHIKI KAISHA (JP)

( * ) Notice: Subject to any disclaimer, the term of this patent is extended or adjusted under 35 U.S.C. 154(b) by 0 days.

(21) Appl. No.: 14/279,679

(22) Filed: May 16, 2014

(65) Prior Publication Data

US 2014/0346349 A1 Nov. 27, 2014

(30) Foreign Application Priority Data

May 21, 2013 (JP) ................................. 2013-107476

(51) Int. Cl.
*H01J 37/30* (2006.01)
*H01J 37/20* (2006.01)
*H01J 37/317* (2006.01)

(52) U.S. Cl.
CPC ............. *H01J 37/20* (2013.01); *H01J 37/3177* (2013.01); *H01J 2237/2001* (2013.01); *H01J 2237/2446* (2013.01); *H01J 2237/24507* (2013.01); *H01J 2237/30438* (2013.01)

(58) Field of Classification Search
USPC ............. 250/307, 77, 30, 397, 491.1, 492.22, 250/492.2, 492.23
See application file for complete search history.

(56) References Cited

U.S. PATENT DOCUMENTS

| 7,522,264 B2 * | 4/2009 | Akamatsu ........................ 355/53 |
| 8,139,198 B2 * | 3/2012 | Nishinaga et al. ............... 355/53 |
| 2002/0101574 A1 * | 8/2002 | Tsuji .............................. 355/69 |

FOREIGN PATENT DOCUMENTS

JP 2005-347054 A 12/2005

* cited by examiner

*Primary Examiner* — Phillip A Johnston
*Assistant Examiner* — Hsien Tsai
(74) *Attorney, Agent, or Firm* — Rossi, Kimms & McDowell LLP

(57) ABSTRACT

The present invention provides a drawing apparatus for performing drawing on a substrate with a charged particle beam, the apparatus comprising an optical system configured to irradiate the substrate with the charged particle beam, a substrate stage configured to hold the substrate, an aperture member provided with the substrate stage, a detector configured to detect a charged particle beam having passed through an aperture of the aperture member, and a support configured to support the detector, wherein the support and the substrate stage are separated from each other.

16 Claims, 3 Drawing Sheets

F I G. 2
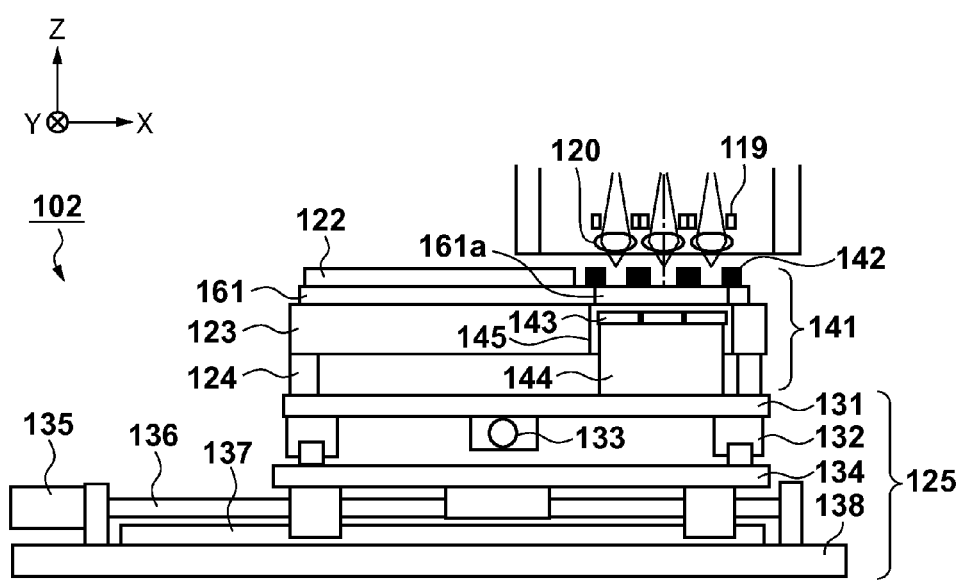

DRAWING APPARATUS, AND METHOD OF MANUFACTURING ARTICLE

BACKGROUND OF THE INVENTION

1. Field of the Invention

The present invention relates to a drawing apparatus, and a method of manufacturing an article.

2. Description of the Related Art

As one of apparatuses used in the manufacturing step (lithography step) of semiconductor devices and the like, a drawing apparatus for drawing a pattern on a substrate using charged particle beams is known. As the design rules of semiconductor devices become finer recently, a high drawing accuracy is required for such a drawing apparatus. To meet this requirement, it is important to accurately measure the relative positions between a substrate stage that holds a substrate and charged particle beams that irradiate the substrate.

Japanese Patent Laid-Open. No. 2005-347054 describes a drawing apparatus in which a detector configured to detect a charged particle beam is provided on a substrate stage that holds a substrate. In the drawing apparatus described in Japanese Patent Laid-Open No. 2005-347054, a charged particle beam is detected by the detector while moving the substrate stage, thereby measuring the relative positions between a plurality of charged particle beats and the substrate stage.

In the drawing apparatus described in Japanese Patent Laid-Open No. 2005-347054, the detector that detects a charged particle beam is provided on the substrate stage. The detector generates heat when irradiated with charged particle beams. When the heat is transmitted to the substrate stage, the substrate stage may deform due to the heat. As a result, it may he impossible to make a charged particle beam correctly strike a target position on the substrate held by the substrate stage.

SUMMARY OF THE INVENTION

The present invention provides, for example, a drawing apparatus advantageous in terms of reducing thermal deformation of a substrate stage.

According to one aspect of the present invention, there is provided a drawing apparatus for performing drawing on a substrate with a charged particle beam, the apparatus comprising: an optical system configured to irradiate the substrate with the charged particle beam; a substrate stage configured to hold the substrate; an aperture member provided with the substrate stage; a detector configured to detect a charged particle beam having passed through an aperture of the aperture member; and a support configured to support the detector; wherein the support and the substrate stage are separated from each other.

Further aspects of the present invention will become apparent from the following description of exemplary embodiments with reference to the attached drawings.

BRIEF DESCRIPTION OF THE DRAWINGS

FIG. 2 is a view showing a stage unit when a chuck member that holds a substrate and a knife edge is used.

DESCRIPTION OF THE EMBODIMENTS

Figure 1:
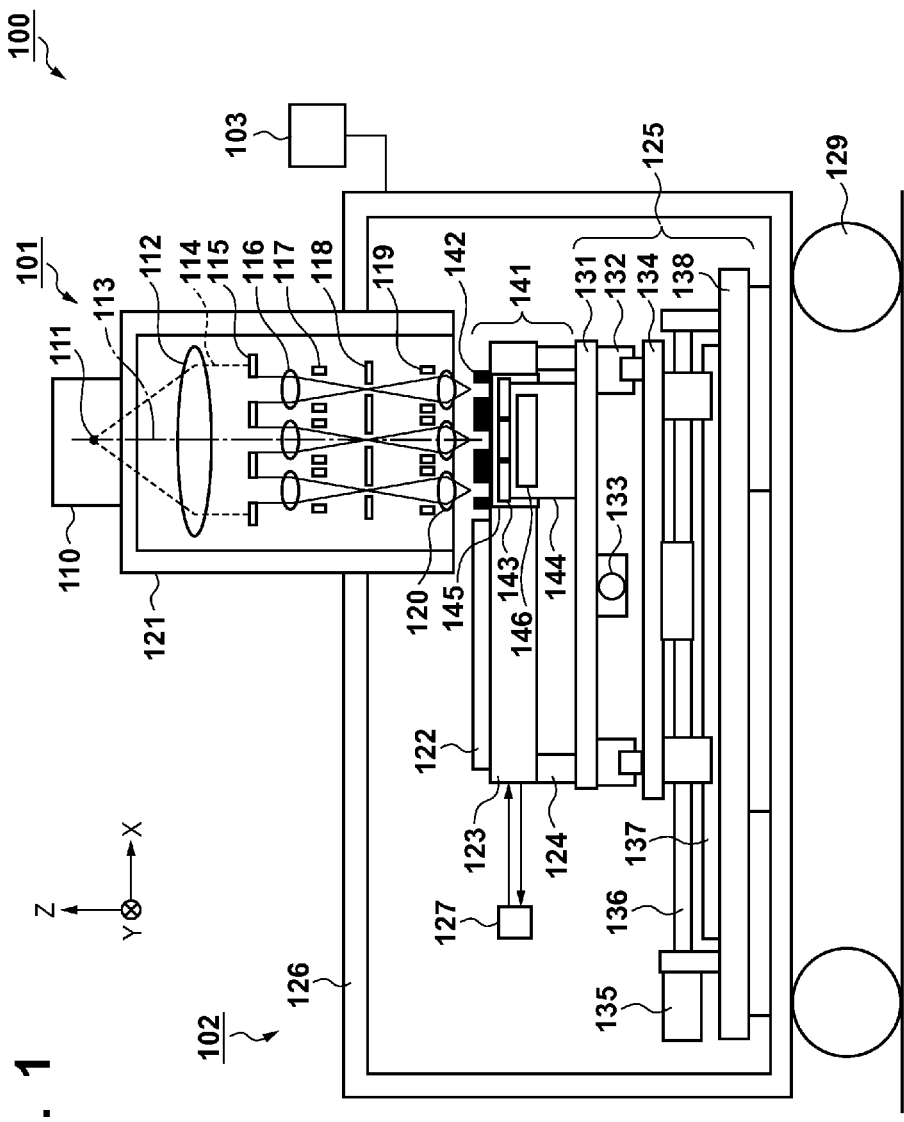
FIG. 1 is a view showing a drawing apparatus according to the first embodiment.

Exemplary embodiments of the present invention will be described below with reference to the accompanying drawings. Note that the same reference numerals denote the same members throughout the drawings, and a repetitive description thereof will not be given. Directions perpendicular to each other on a substrate surface will be defined as X and Y direction, and a direction perpendicular to the substrate surface will be defined as a Z direction throughout the drawings.

<First Embodiment>

A drawing apparatus 100 according to the first embodiment of the present invention will he described with reference to FIG. 1. FIG. 1 is a view showing the drawing apparatus 100 according to the first embodiment. The drawing apparatus 100 according to the first embodiment includes an optical system 101 that irradiates a substrate with a plurality of charged particle beams, a stage unit 102 that holds a substrate, and a control unit 103 that controls the units of the drawing apparatus 100. The drawing apparatus 100 can draw a pattern on a substrate by irradiating a resist applied to the substrate with a plurality of charged particle beams. The control unit 103 includes a CPU and a memory, and controls drawing processing (processing of performing drawing on a substrate 122) of the drawing apparatus 100.

The optical system 101 includes, for example, a charged particle source 110, a collimator lens 112, an aperture array 115, first electrostatic lenses 116, a blanking deflector 117, blanking apertures 118, a deflector 119, and second electrostatic lenses 120. A charged particle beam 113 emitted by the charged particle source 110 forms a crossover image 111, changes to a parallel beam by the effect of the collimator lens 112, and enters the aperture array 115. The aperture array 115 has a plurality of apertures arrayed in a matrix, which divide a charged particle beam 114 that has entered as a parallel beam into a plurality of charged particle beams. The charged particle beams divided by the aperture array 115 enter the first electrostatic lenses 116. The charged particle beams that have passed through the first electrostatic lenses 116 form intermediate images of the crossover image 111. The blanking deflector 117 including a plurality of blankers is installed on the plane where the intermediate images are formed.

The blanking deflector 117 individually deflects the plurality of charged particle beams. The charged particle beams deflected by the blanking deflector 117 are blocked by the blanking apertures 119 installed at the subsequent stage of the blanking deflector 117, and therefore do not reach the substrate. That is, the blanking deflector 117 switches irradiation and non-irradiation of charged particle beams on the substrate 122. The charged particle beams that have passed through the blanking apertures 118 enter the deflector 119 configured to scan the charged particle beams on the substrate 122. The deflector 119 deflects the plurality of charged particle beams in, for example, the X direction (scanning direction) simultaneously at once in parallel to the deflection of the charged particle beams by the blanking deflector 117. The plurality of charged particle beams that have passed through the second electrostatic lenses 120 can thus be scanned on the substrate. The second electrostatic, lenses 120 form images of the charged particle beams that have passed through the deflector 119 on the substrate. The crossover image 111 is thus reduced and projected onto the substrate. The substrate 122 is held by the stage unit 102 (to be described later) and continuously moved by the stage unit 102 in a direction (Y direction) perpendicular to the scanning direction (X direction) of the deflector 119. The stage unit 102 may move the substrate in the direction perpendicular to the scanning direction of the deflector 119. However, the present invention is not limited to this, and the substrate may be moved in another direction. Since charged particle beams attenuate in the atmosphere, the optical system 101 is arranged in an electron optical barrel 121 kept in a vacuum state by a vacuum pump (not shown).

The stage unit 102 includes, for example, a substrate stage 123, a stage driving unit 124, and a coarse motion stage 125. The stage unit 102 also includes a stage position measurement unit 127 that measures the position of the substrate stage 123. The substrate stage 123 is arranged to include a portion where the substrate 122 is held and a portion where a knife edge 142 (to be described later) is arranged. The stage driving unit 124 drives the substrate stage 123 in six-axial directions and adjusts the position of the substrate 122 held by the substrate stage 123. The coarse motion stage 125 includes a Y driving unit and an X driving unit, and is configured to move in the X and Y directions in a stroke larger than the moving stroke of the substrate stage 123 together with the stage driving unit 124.

The Y driving unit includes a Y top plate 131 that supports the substrate stage 123 via the stage driving unit 124, a YLM guide 132 that guides the movement of the Y top plate 131, a Y ball screw 133 that drives the Y top plate 131, and a Y rotation motor that rotates the shaft of the Y ball screw 133. The Y driving unit activates the Y rotation motor and causes it to rotate the shaft of the Y ball screw 133, thereby moving the Y top plate 131 in the Y direction along the YLM guide 132. The X driving unit includes an X top plate 134 that supports the Y driving unit, an XLM guide 137 that guides the movement of the X top plate 134, an X ball screw 136 that drives the X top plate 134, and an X rotation motor 135 that rotates the shaft of the X ball screw 136. The X driving unit activates the X rotation motor 135 and causes it to rotate the shaft of the X ball screw 136, thereby moving the X top plate 134 in the X direction along the XLM guide 137.

The stage unit 102 is arranged in a vacuum chamber 126 kept in a vacuum state by a vacuum pump (not shown), and the coarse motion stage 125 is fixed in the vacuum chamber 126 via a stage base 138. The vacuum chamber 126 is fixed, via mounts 129, on the foundation portion (floor) of the place where the drawing apparatus 100 is arranged. It is therefore possible to reduce vibrations transmitted from the foundation portion to the stage unit 102 or the optical system 101.

The stage position measurement unit 127 includes, for example, a laser interferometer and an encoder, and measures the position of the substrate stage 123. An example in which the stage position measurement unit 127 includes a laser interferometer will be explained here. The laser interferometer emits a laser beam to a reflecting plate (not shown) provided on the substrate stage 123, and detects the displacement of the substrate stage 123 from a reference position based on the laser beam reflected by the reflecting plate. The stage position measurement unit 127 can thus decide the current position of the substrate stage 123 based on the displacement detected by the laser interferometer. The stage position measurement unit 127 can include one or more laser interferometers configured to detect the displacement of the substrate stage 123 in the X direction, and one or more laser interferometers configured to detect the displacement of the substrate stage 123 in the Y direction. The stage position measurement unit 127 can thus accurately measure the X- and Y-direction positions of the substrate stage 123.

The drawing apparatus 100 having the above-described arrangement is required to have a high drawing accuracy as the design rules of semiconductor devices become finer recently. To meet this requirement, it is important to accurately measure the relative positions between the substrate stage 123 that holds the substrate 122 and a plurality of charged particle beams emitted by the optical system 101. To do this, the drawing apparatus 100 according to the first embodiment is provided with the measurement unit 141 including a detection unit 143 that detects the plurality of charged particle beams. The relative positions between the substrate stage 123 and the plurality of charged particle beams can be measured by the measurement unit 141. The detection unit 143 generates heat when irradiated with charged particle beams. For this reason, if the detection unit 143 is provided on the substrate stage 123, like the drawing apparatus described in Japanese Patent Laid-Open No. 2005-347054, the heat generated in the detection unit 143 is transmitted to the substrate stage 123, the substrate stage 123 may deform due to the heat. As a result, it may be impossible to make a charged particle beam correctly strike a target position on the substrate 122 held by the substrate stage 123. In the drawing apparatus 100 according to the first embodiment, the detection unit 143 is supported by a support member 144 so as to suppress transmission of the heat of the detection unit 143 to the substrate stage 123, that is, transmit the heat of the detection unit 143 to a member separated from the substrate stage 123. The arrangement of the measurement unit 141 in the drawing apparatus 100 according to the first embodiment will be described below.

The measurement unit 141 includes the knife edge 142 (aperture member) having a plurality of apertures (aperture slits) configured to pass charged particle beams, the detection unit 143 that detects the plurality of charged particle beams that have passed through the apertures of the knife edge 142, and the support member 144 that supports the detection unit 143. The knife edge 142 is made of, for example, a grounded metal and has a plurality of apertures configured to pass the charged particle beams emitted by the optical system 101. The knife edge 142 is provided in a portion of the substrate stage 123 different from the portion where the substrate 122 is held. Each aperture functions as the reference position of the substrate stage 123. In the drawing apparatus 100 according to the first embodiment, the substrate 122 and the knife edge 142 are held by the substrate stage 123. However, the present invention is not limited to this. For example, the drawing apparatus 100 may include a chuck member 161, as shown in FIG. 2, and the substrate 122 and the knife edge 142 may be held by the substrate stage 123 via the chuck member 161. FIG. 2 is a view showing the stage unit 102 when the chuck member 161 that holds the substrate 122 and the knife edge 142 is used. The chuck member 161 is detachably formed on the substrate stage 123 and has, at a portion where the knife edge 142 is held, a through-hole 161a to pass the charged particle beams that have passed through the knife edge 142. The position of the substrate 122 can thus be controlled using the position of the knife edge 142 as a reference.

The substrate stage 123 has, at a portion where the knife edge 142 is provided, a through-hole 145 to pass the plurality of charged particle beams that have passed through the knife edge 142. The plurality of charged particle beams that have passed through the knife edge 142 enter the detection unit 143 arranged in the through-hole 145. The detection unit 143 is supported by the support member 144 such that the detection unit 143 does not come into contact with the substrate stage 123, and the distance between the detection unit 143 and the knife edge 142 becomes short. The detection unit 143 includes a plurality of detectors arranged to detect the plurality of charged particle beams, respectively. The detectors include, for example, a photodiode CCD sensor, or Faraday cup, and are arranged so that one charged particle beam enters one detector. For example, when three charges particle beams are emitted by the optical system 101, as shown in FIG. 1, three apertures are formed in the knife edge 142 at positions where the charged particle beams enter. In addition, the detection unit 143 includes three detectors that respectively detect the three charged particle beams that have passed through the three apertures. The drawing apparatus 100 according to the first embodiment is configured to cause the optical system 101 to emit three charged particle beams. However, the drawing apparatus may be configured to cause the optical system 101 to emit one or a plurality of charged particle beams.

The support member 144 is supported by the coarse motion stage 125, and transmits heat of the detection unit 143 generated when irradiated with the charged particle beams to the coarse motion stage 125. That is, the support member 144 is spatially separated from the substrate stage 123 and can therefore suppress transmission of heat of the detection unit 143 to the substrate stage 123. The support member 144 can use, for example, a metal member having a high heat conductivity so that heat of the detection unit 143 is efficiently transmitted to the coarse motion stage 125. The drawing apparatus 100 according to the first embodiment is configured to transmit heat of the detection unit 143 to the coarse motion stage 125 via the support member 144. However, the present invention is not limited to this, and the drawing apparatus need only be configured to suppress transmission of the heat to the substrate stage 123. That is, the drawing apparatus 100 need only be configured to transmit the heat to a member separated from the substrate stage 123 via the support member 144.

In the detection unit 143 (each detector), each of a plurality of pixels included in it outputs a signal corresponding to the current amount of a charged particle beam that has entered the pixel. The outputs from the pixels of the detection unit 143 are supplied to the control unit 103. The control unit 103 acquires the intensity distribution (beam intensity, beam shape) of the charged particle beams based on the outputs of the pixels of the detection unit 143. Using the thus acquired intensity distribution of the charged particle beams and information representing the position on the substrate stage where the knife edge 142 is provided, the control unit 103 decides the relative positions (the characteristic of each charged particle beam) between the charged particle beams and the substrate stage 123. The control unit 103 controls the operation of at least one of the optical system 101 and the substrate stage 123 based on the characteristic of each charged particle beam. More specifically, when performing drawing on the substrate 122, the control unit 103 performs offset correction of the position of the substrate stage 123 measured by the stage position measurement unit 127 using the decided relative positions between the charged particle beams and the substrate stage 123. It is therefore possible to make each charged particle beam strike a target position on the substrate and improve the drawing accuracy of the drawing apparatus 100.

In the drawing apparatus 100 according to the first embodiment, when performing drawing on the substrate 122, the position of the substrate stage 123 is corrected using the relative positions between the charged particle beams and the substrate stage 123 decided by the control unit 103. However, the present invention is not limited to the correction of the position of the substrate stage 123. For example, the deflection amounts of the charged particle beams in the deflector 119 of the optical system 101 may be corrected using the relative positions between the charged particle beams and the substrate stage 123 decided by the control unit 103. In the drawing apparatus 100 according to the first embodiment, the control unit 103 decides the relative positions between the charged particle beams and the substrate stage 123, that is, decides the relative position with respect to the substrate stage for each charged particle beam. However, the present invention is not limited to this. For example, a representative position in the plurality of charged particle beams as a whole may be decided as the relative position with respect to the substrate stage 123. As the representative position, the relative position between the substrate stage 123 and one of the plurality of charged particle beams may be used. Alternatively, the relative position between the substrate stage 123 and the center of the plurality of charged particle beams may be used.

As described above, in the drawing apparatus 100 according to the first embodiment, the detection unit 143 that detects charged particle beams is supported by the coarse motion stage 15 via the support member 144 in the measurement unit 141 that measures the relative positions between the charged particle beams and the substrate stage 123. Hence, the heat of the detection unit 143 generated when irradiated with charged particle beams upon measuring the relative positions between the charged particle beams and the substrate stage 123 can be transmitted to the coarse motion stage 125. That is, it is possible to suppress transmission of the heat of the detection unit 143 to the substrate stage 123. This makes it possible to reduce deformation of the substrates stage 123 caused by the heat and accurately measure the relative positions between the charged particle beams and the substrate stage 123. Hence, the drawing apparatus 100 according to the first embodiment can perform drawing on the substrate 122 at a high drawing accuracy.

In the drawing apparatus 100 according to the first embodiment, for example, as shown in FIG. 2, a cooling unit 146 configured to cool the detection unit 143 may be provided in the support member 144. Since this can suppress an increase in the temperature of the detection unit 143, radiant heat from the detection unit 143 to the substrate stage 123 can be reduced. It is therefore possible to further reduce the influence of the heat of the detection unit 143 on the substrate stage 123.

In the drawing apparatus 100 according to the first embodiment, the detection unit 143 is configured to directly detect charged particle beams that have entered. However, the detection unit 143 may be configured to convert the charged particle beams into light and detect the converted light. The detection unit 143 configured in this way can include, for example, a converter (for example, phosphor screen) that converts a charged particle beam that has entered the detection unit 143 into light, and a photodetector that receives the light from the converter and detects the intensity of the received light. in this case, for example, a photodiode, CCD sensor, or CMOS sensor is usable as the photodetector. As described above, when the detection unit 143 is configured to Convert Charged particle beams into light, the light from the converter can be guided outside the vacuum chamber 126 through a transparent window provided in the side wall of the vacuum chamber 126. For this reason, the photodetetor can be arranged outside the vacuum chamber 126, and transmission of heat (radiant heat) of the photodetector, which is generated when irradiated with the light, to the substrate stage 123 can be suppressed.

<Second Embodiment>

Figure 3:
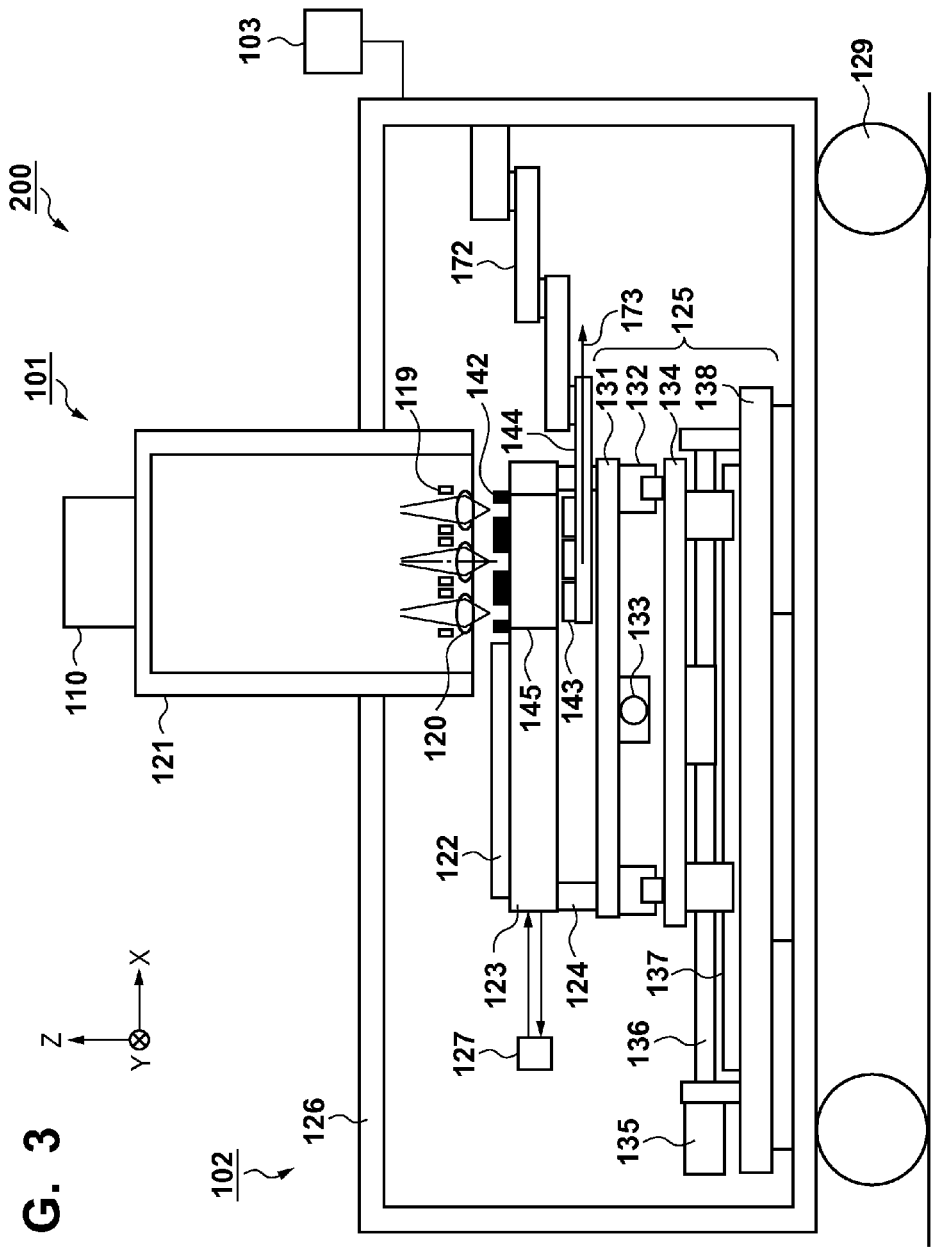
FIG. 3 is a view showing a drawing apparatus according to the second embodiment.

A drawing apparatus 200 according to the second embodiment of the present invention will be described with reference to FIG. 3. FIG. 3 is a view showing the drawing apparatus 200 according to the second embodiment. The drawing apparatus 200 according to the second embodiment is different from the drawing apparatus 100 according to the first embodiment in the arrangement of a measurement unit 141. A support member 144 is supported by a driving unit 172. The driving unit 172 can move the support member 144 and is supported by a vacuum chamber 126. Hence, the measurement unit 141 according to the second embodiment is configured to transmit heat of a detection unit 143 not to a coarse motion stage 125, as in the first embodiment, but to the vacuum chamber 126 via the driving unit 172. In the second embodiment, the driving unit 172 is supported by the vacuum chamber 126. However, the present invention is not limited to this, and the driving unit 172 need only be supported by a member separated from a substrate stage 123, for example, a stage base 138 or an optical system 101.

In the drawing apparatus 200 having the above-described arrangement, when a detection unit 143 detects charged particle beams, the support member 144 can be moved by the driving unit 172 so as to arrange the detection unit 143 under a knife edge 142. On the other hand, when the detection unit 143 does not detect charged particle beams in a case where, for example, the drawing apparatus 200 performs drawing on a substrate, the support member 144 can be moved by the driving unit 172 in the direction of an arrow 173 so as to arrange the detection unit 143 at a retractive position. In the drawing apparatus 200, the detection unit 143 can be arranged at the retractive position when it does not detect charged particle beams. For this reason, when performing drawing on a substrate 122, transmission of radiant heat from the detection unit 143 to the substrate stage 123 can be suppressed. That is, it is possible to further reduce the influence of radiant heat of the detection unit 143 on the substrate stage.

As described above, the drawing apparatus 200 according to the second embodiment includes the driving unit 172 that moves the support member 144 supporting the detection unit 143. Hence, the drawing apparatus 200 according to the second embodiment can arrange the detection unit 143 at the retractive position when it does not detect charged particle beams in a case where, for example, drawing on the substrate 122 is performed. This can suppress transmission of radiant heat from the detection unit 143 to the substrate stage 123.

<Embodiment of Method of Manufacturing Article>

A method of manufacturing an article according to an embodiment of the present invention is suitable for manufacturing an article, for example, a micro device such as a semiconductor device or an element having a fine structure. The method of manufacturing an article according to the embodiment includes a step of forming a latent image pattern on a photoresist applied to a substrate using the above drawing apparatus (a step of performing drawing on a substrate), and a step of developing the substrate on which the latent image pattern is formed in the above step. The manufacturing method also includes other known processes (for example, oxidation, deposition, vapor deposition, doping, planarization, etching, resist removal, dicing, bonding, and packaging). The method of manufacturing an article according to this embodiment is advantageous in at least one of the performance, quality, productivity, and production cost of the article, as compared to conventional methods.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2013-107476 filed on May 21, 2013, which is hereby incorporated by reference herein in its entirety.

What is claimed is:

1. A drawing apparatus for performing drawing on a substrate with a charged particle beam, the apparatus comprising:
    an optical system configured to irradiate the substrate with the charged particle beam;
    a substrate stage configured to move while holding the substrate;
    an aperture member provided on the substrate stage;
    a detector configured to detect a charged particle beam having passed through an aperture of the aperture member; and
    a support configured to support the detector,
    wherein the support and the substrate stage are separated from each other, and the support is supported by a member, which is different from the substrate stage and is able to be positioned at an opposite side to a surface of the substrate stage holding the substrate.

2. The apparatus according to claim 1, further comprising a driving device configured to move the support so as to arrange the detector under the aperture member in a case where the detector detects a charged particle beam.

3. The apparatus according to claim 1, further comprising a controller configured to obtain a characteristic of the charged particle beam based on information representing a position of the substrate stage and an output from the detector.

4. The apparatus according to claim 3, wherein the controller is configured to control an operation of at least one of the optical system and the substrate stage based on the characteristic.

5. The apparatus according to claim 1, wherein the detector includes a converter configured to convert a charged particle beam having entered the detector into light, and a photodetector configured to detect the light from the converter.

6. The apparatus according to claim 1, further comprising a cooler configured to cool the detector.

7. A method of manufacturing an article, the method comprising steps of:
    performing drawing on a substrate using a drawing apparatus;
    developing the substrate on which the drawing has been performed; and
    processing the developed substrate to manufacture the article,
    wherein the drawing apparatus performs drawing on the substrate with a charged particle beam, and includes:
    an optical system configured to irradiate the substrate with the charged particle beam;
    a substrate stage configured to move while holding the substrate;
    an aperture member provided on the substrate stage;
    a detector configured to detect a charged particle beam having passed through an aperture of the aperture member; and
    a support configured to support the detector,
    wherein the support and the substrate stage are separated from each other, and the support is supported by a member, which is different from the substrate stage and is able to be positioned at an opposite side to a surface of the substrate stage holding the substrate.

8. The apparatus according to claim 1, wherein
    the substrate stage includes a through-hole, and
    the detector is configured to detect the charged particle beam having passed through the aperture of the aperture member and at least a part of the through-hole.

9. The apparatus according to claim 8, wherein the support is configured to support the detector such that the detector is arranged in the through-hole.

10. The apparatus according to claim 1, wherein the member includes a moving member which moves the substrate stage.

11. The apparatus according to claim 10, wherein the moving member includes a stage which moves in a stroke larger than a moving stroke of the substrate stage.

12. The apparatus according to claim 3, wherein the characteristic includes a relative position between the charged particle beam and the substrate stage.

13. A drawing apparatus for performing drawing on a substrate with a charged particle beam, the apparatus comprising:
   an optical system configured to irradiate the substrate with the charged particle beam;
   a substrate stage configured to move while holding the substrate;
   an aperture member provided on the substrate stage; and
   a detector configured to detect a charged particle beam having passed through an aperture of the aperture member,
   wherein the detector is supported by a member, which is different from the substrate stage and is able to be positioned at an opposite side to a surface of the substrate stage holding the substrate.

14. The apparatus according to claim 13, wherein
   the substrate stage includes a beam transmitting space, and
   the detector is configured to detect the charged particle beam having passed through the aperture of the aperture member and at least a part of the beam transmitting space.

15. The apparatus according to claim 1, wherein the member is configured to support the detector so as not to be in contact with the substrate stage, and be positioned in accordance with a position of the substrate stage.

16. The apparatus according to claim 13, wherein the member is configured to support the detector so as not to be in contact with the substrate stage, and be positioned in accordance with a position of the substrate stage.

* * * * *